US011677360B2

(12) United States Patent
Yin et al.

(10) Patent No.: US 11,677,360 B2
(45) Date of Patent: Jun. 13, 2023

(54) EQUALIZATION IN A MULTI-PATH AUDIO AMPLIFIER FOR CANCELING VARIATIONS DUE TO MULTI-PATH OUTPUT IMPEDANCE DIFFERENCES

(71) Applicant: CIRRUS LOGIC INTERNATIONAL SEMICONDUCTOR LTD., Edinburgh (GB)

(72) Inventors: Leyi Yin, Austin, TX (US); John L. Melanson, Austin, TX (US); Eric Lindemann, Boulder, CO (US); Amar Vellanki, Cedar Park, TX (US); Jianhao Chen, Austin, TX (US); Venugopal Choukinishi, Austin, TX (US); Wai-Shun Shum, Austin, TX (US); Xiaofan Fei, Austin, TX (US)

(73) Assignee: CIRRUS LOGIC, INC., Austin, TX (US)

(*) Notice: Subject to any disclaimer, the term of this patent is extended or adjusted under 35 U.S.C. 154(b) by 0 days.

(21) Appl. No.: 17/521,268

(22) Filed: Nov. 8, 2021

(65) Prior Publication Data
US 2022/0329216 A1   Oct. 13, 2022

Related U.S. Application Data

(60) Provisional application No. 63/172,840, filed on Apr. 9, 2021.

(51) Int. Cl.
*H03F 3/183* (2006.01)
*H04R 3/04* (2006.01)
*H04R 29/00* (2006.01)

(52) U.S. Cl.
CPC ............. *H03F 3/183* (2013.01); *H04R 3/04* (2013.01); *H04R 29/001* (2013.01); *H03F 2200/03* (2013.01); *H04R 2430/01* (2013.01)

(58) Field of Classification Search
CPC ...... H03F 3/183; H03F 2200/03; H03F 3/187; H03F 1/56; H03F 3/68; H03F 3/211;
(Continued)

(56) References Cited

U.S. PATENT DOCUMENTS 4,979,217 A * 12/1990 Shipley ................. H04H 20/83
381/81
10,181,845 B1   1/2019 Das et al.
(Continued)

FOREIGN PATENT DOCUMENTS

CH           658963 A5    12/1986
EP          0577901 A1     1/1994

*Primary Examiner* — Vivian C Chin
*Assistant Examiner* — Friedrich Fahnert
(74) *Attorney, Agent, or Firm* — Mitch Harris, Atty at Law, LLC; Andrew M. Harris (57) ABSTRACT

A multi-path audio amplification system that provides an output drive signal to electromechanical output transducers provides improved undistorted headroom, reduced path switching noise, and/or improved frequency response performance. Multiple signal amplification paths receive an audio input signal and have corresponding multiple output stages that have differing output impedances. A mode selector selects an active one of the multiple signal amplification paths is selected to supply the output drive signal. Outputs of the multiple output stages are coupled to the electromechanical transducer to provide the output drive signal and at least one of the multiple signal amplification paths includes an equalization filter for filtering the audio input signal to compensate for phase or gain differences referenced from the input to the outputs of the multiple output stages due to interaction between the differing output impedances and an impedance of the electromechanical transducer.

20 Claims, 7 Drawing Sheets

(58) Field of Classification Search
CPC ... H03F 1/0277; H03F 2203/211; H04R 3/04; H04R 29/001; H04R 2430/01; H03G 5/005; H03G 5/165
USPC .......................................................... 381/59
See application file for complete search history.

(56) References Cited

U.S. PATENT DOCUMENTS

| | | | |
|---|---|---|---|
| 10,637,423 B2 | 4/2020 | Vellanki et al. | |
| 2013/0070930 A1* | 3/2013 | Johnson | H04R 29/00 381/57 |

* cited by examiner

EQUALIZATION IN A MULTI-PATH AUDIO AMPLIFIER FOR CANCELING VARIATIONS DUE TO MULTI-PATH OUTPUT IMPEDANCE DIFFERENCES

The present application Claims priority under 35 U.S.C. § 119(e) to U.S. Provisional Patent Application 63/172,840 filed on Apr. 9, 2021, the disclosure of which is incorporated herein by reference.

BACKGROUND

1. Field of Disclosure

The field of representative embodiments of this disclosure relates to amplifier methods and circuits that compensate for differences in output impedance between multiple paths of an audio amplification system.

2. Background

Audio amplifiers have been implemented that provide high-efficiency during large signal operation and low distortion and power consumption during small signal operation. For example, an open-loop controlled-current driver, e.g., a current output digital-to-analog converter (IDAC) may be used during high amplitude portions of an audio program reproduced from an integrated circuit (IC) audio amplifier output designed for operating earphones, while a closed-loop voltage-controlled driver, e.g., an op-amp or voltage output digital-to-analog converter (VDAC) may be used to reproduce lower-amplitude portions of the audio program with low distortion and accuracy. However, a controlled-current amplifier typically has a very high output impedance (near infinite) with respect to the output load impedance, while a controlled-voltage amplifier typically has a very low (near zero) output impedance. The load, which is typically a low-impedance electromechanical transducer such as a voice-coil based speaker, but which may be applicable to other audio output transducer types as well, typically has a dramatic rise in impedance around the primary mechanical resonance, but due to either the transducer structure or the airspace surrounding the transducer, other resonances may be present that cause large changes in transducer impedance, as well.

In particular, when the audio amplifier output has high output impedance, the voltage to reproduce high current levels due to high-amplitude portions of the audio program may approach or exceed the power supply rails provided to the output stage, causing saturation or "clipping" and consequent signal distortion. The voltage divider formed by the output impedance and frequency-dependent characteristics of the load impedance, particularly at the bottom of the usable frequency range of the audio output transducer, which is typically just above the transducer's primary mechanical resonance, affects the phase and amplitude response of the overall amplifier-to-load transfer function.

In a multi-path audio amplifier having output stages with different output impedances, changing the selected active amplifier path between a high-output-impedance path and a low-output-impedance path, on-the-fly, will typically cause "pops" or "clicks" due to the different relative match between the output impedances and the impedance of the load. The difference in output impedance forms part of a change in overall audio amplifier transfer function when a different active path is selected, and the transfer function may be further affected by any changes from closed-loop to open-loop control, in part because an output impedance mis-match is not compensated-for in open-loop path topology as it may be in a closed-loop path topology.

Therefore, it would be advantageous to provide a multi-path audio amplification system that reduces noise produced from path switching, provides reduced distortion at maximum output signal swing, and/or provides improved frequency response performance.

SUMMARY

Reduced path-switching noise, reduced distortion at maximum output signal swing, and/or improved frequency and phase response performance in a multi-path audio amplifier is accomplished in amplification systems and their methods of operation.

The systems and methods provide an output signal to electromechanical output transducers and include an input stage for receiving an audio input signal, a mode selector for selecting one of multiple operating modes of the audio amplification system and multiple signal amplification paths having inputs coupled to the audio input and having corresponding ones of multiple output stages having differing output impedances. An active one of the multiple signal amplification paths is selected according to an active one of the multiple operating modes to supply the output drive signal. Outputs of the multiple output stages are coupled to the electromechanical transducer to provide the output drive signal and at least one of the multiple signal amplification paths includes an equalization filter for filtering the audio input signal to compensate for phase or gain differences referenced from the input to the outputs of the multiple output stages due to interaction between the differing output impedances and an impedance of the electromechanical transducer.

The summary above is provided for brief explanation and does not restrict the scope of the Claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses multi-path audio amplification systems that provide an output drive signal to electromechanical output transducers. The disclosed audio amplification systems provide improved headroom, reduced path switching noise and/or frequency response performance. Multiple signal amplification paths receive an audio input signal and have corresponding multiple output stages that have differing output impedances. A mode selector selects an active one of the multiple signal amplification paths is selected to supply the output drive signal. Outputs of the multiple output stages are coupled to the electromechanical transducer to provide the output drive signal and at least one of the multiple signal amplification paths includes an equalization filter for filtering the audio input signal to compensate for phase or gain differences referenced from the input to the outputs of the multiple output stages due to interaction between the differing output impedances and an impedance of the electromechanical transducer.

Figure 1:
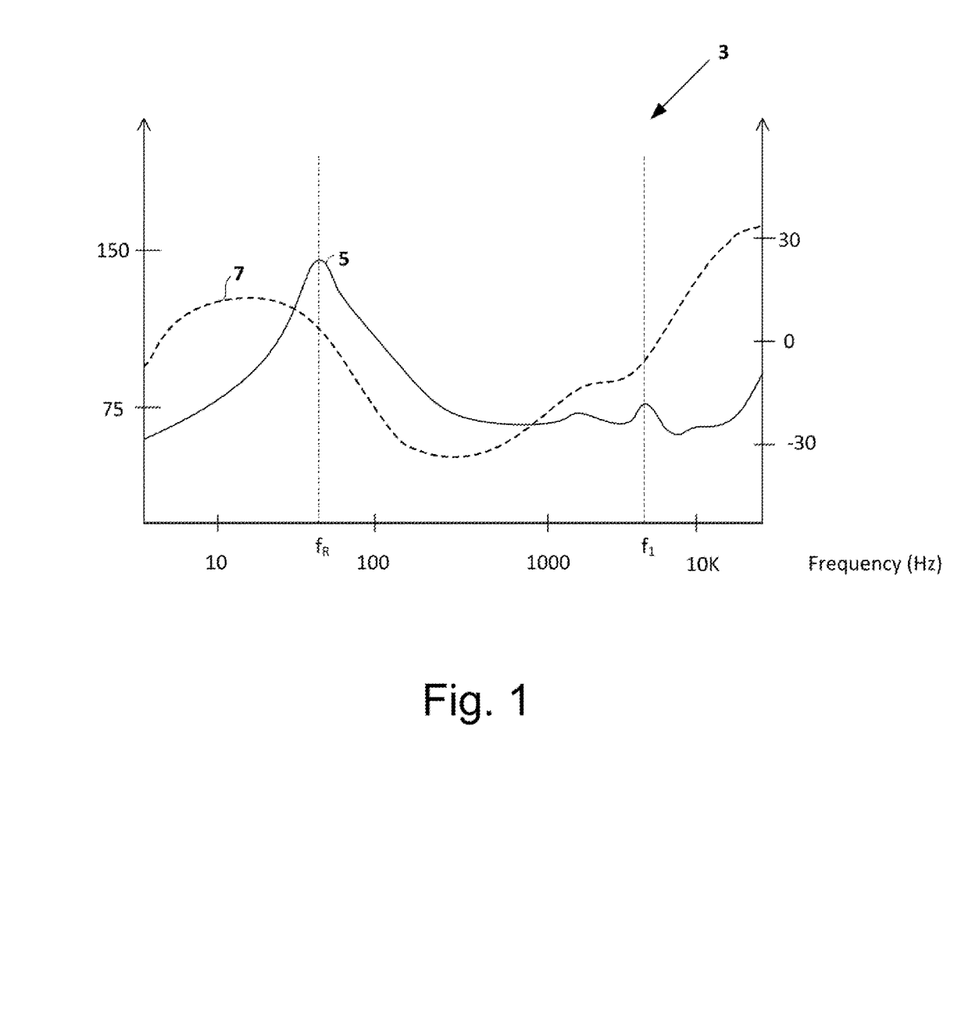
FIG. 1 is a graph 3 showing an example frequency-dependent impedance magnitude 5 and an example frequency-dependent impedance phase 7 of an audio transducer 47 that may be included in system 40 of FIG. 4, in accordance with an embodiment of the disclosure.
Figure 4:
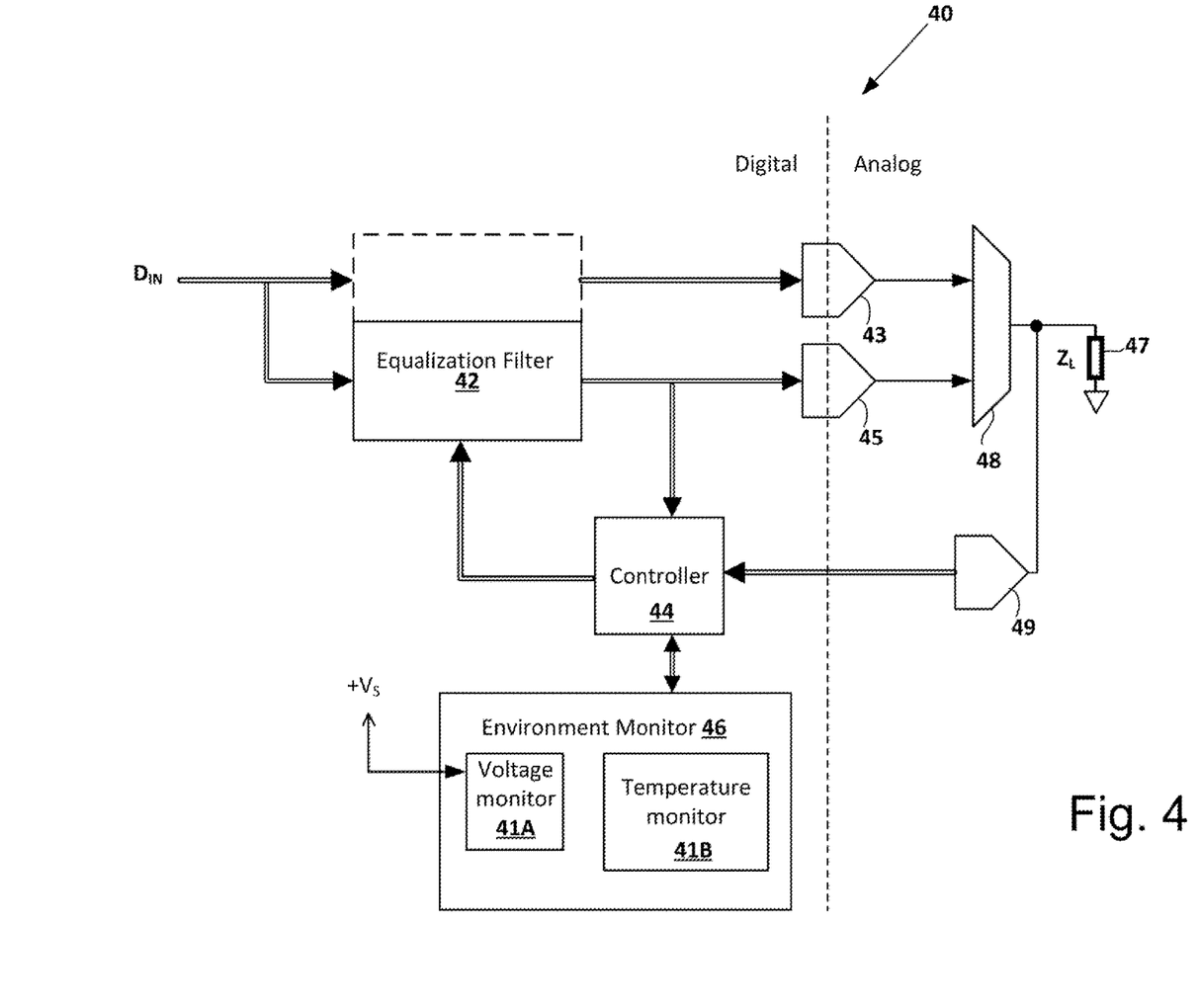
FIG. 4 is a block diagram of an example system 40 in accordance with an embodiment of the disclosure.

FIG. 1 is a graph 3 showing an example frequency-dependent impedance magnitude 5 and an example frequency-dependent impedance phase 7 of an audio transducer 47 that may be included in system 40 of FIG. 4, in accordance with an embodiment of the disclosure. The example audio response is that of an earspeaker having a fundamental mechanical resonance $f_R$ at approximately 80 Hz. An additional mechanical resonance $f_1$, can be seen at approximately 6 kHz. Other mechanical transducer types, such as haptic transducers, may be driven with systems according to the example embodiments described below, and although the resonant frequencies will generally differ for such transducers and other types of audio transducers, such as loudspeakers, the techniques disclosed herein are generally applicable to driving various types of electromechanical transducers. Since the impedance of transducer 47 will interact with any finite output impedance of a system that is driving that impedance, the frequency and phase responses of the overall system also have variation with both the impedance of the transducer and the finite output impedance of the driving system, which is generally due to the output stage characteristics and the presence or absence of feedback that may cancel some or all of the output stage impedance. In particular, for current-based outputs such as current-output digital to analog converters (IDACs) that may be used to efficiently provide power to transducer 47 at higher signal amplitudes, the output impedance of current-based outputs, i.e., outputs in which a driven output current is proportional to the input signal, is ideally infinite and in implementations can be very large. The result is that the voltage required at the current-based output may approach the available power supply rail voltage, causing distortion and "clipping" of the output signal. Also, for multi-path signal amplifiers as described in further detail below, differences in the output impedance of the amplifiers may cause "pops" and "clicks" when the path selection is changed, as even a small change in signal level due to a mismatch in amplitude of the signals generated by the different paths may be audible, particularly at lower signal amplitudes where the "pops" and "clicks" are not masked by an audio program being reproduced.

The impedance of transducer 47 is generally very sensitive to temperature, and temperature variation as the output signal changes from low amplitudes to higher amplitudes, is also generally significant, as the wire resistance of windings used to fabricate devices such as earspeakers, loudspeakers and haptics may account for half (or more) of the device terminal impedance at lower frequencies. The output impedance of the output stage may also vary significantly with temperature due to characteristics of the transistors used to implement the output stage(s) and also varies due to variation in power supply voltage. In order to reduce or eliminate variation in the overall frequency response of a system driving an electromechanical transducer, the systems described below employ a filter that has a response generally tailored to an inverse of the frequency-dependent system phase and amplitude response variation due to the impedance of transducer 47, at least within frequency bands in which the load impedance is expected to cause audible distortion. In at least some example embodiments, the disclosed system compensates for thermal and power supply variations.

Figure 2A:
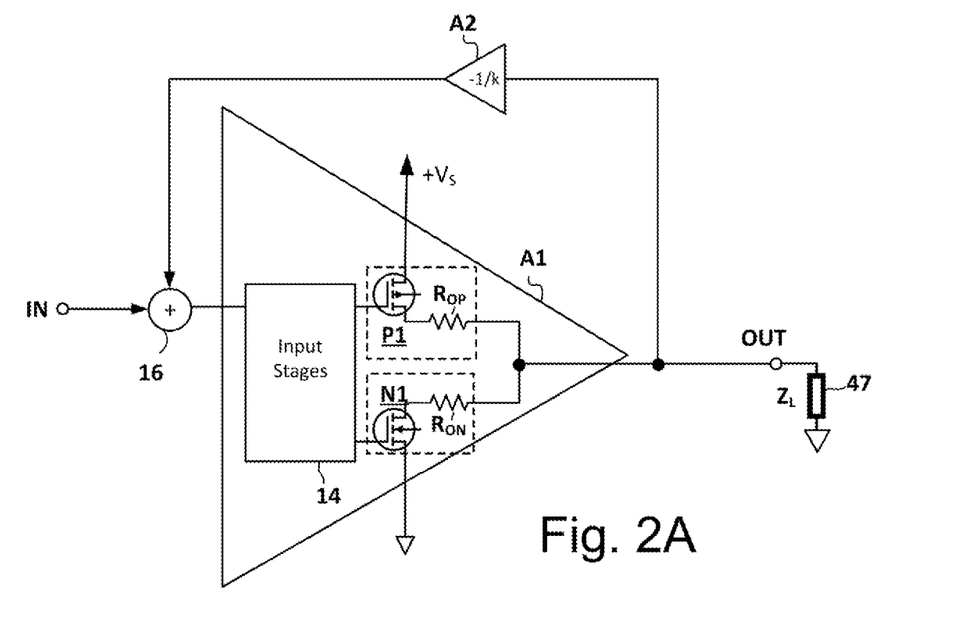
FIG. 2A is a simplified schematic diagram of an example amplifier A1, illustrating a circuit having a voltage-based output that may be included in system 40 of FIG. 4, in accordance with an embodiment of the disclosure.

Referring now to FIG. 2A, a simplified schematic diagram of an example amplifier A1, illustrating a circuit having a voltage-based output that may be included in system 40 of FIG. 4, in accordance with an embodiment of the disclosure. An output stage of amplifier A1 is formed by two transistors N1 and P1 that contribute an output resistance $R_{OP}$ and $R_{ON}$, respectively, which determines an average output impedance of amplifier A1. Input stages 14 receive an input voltage IN and provide signals to the gates of transistors N1 and P1. In the depicted example, which is simplified for illustration, a feedback attenuator A2 having a gain of $-1/k$ and a combiner 16 provide feedback around amplifier A1. The effect of feedback on the output resistance of a voltage amplifier such as amplifier A1 is a reduction according to the open-loop gain $A_{VOL}$ of amplifier A1. Estimating an average output resistance as $(R_{OP}+R_{ON})/2$, the feedback-altered resistance becomes $(R_{OP}+R_{ON})/A_{VOL}$, where $A_{VOL}$ is the open-loop gain of amplifier A1, since the feedback encompasses the output resistances $R_{OP}$ and $R_{ON}$. Therefore, example amplifier A1 illustrates a signal path having low output resistance. Without feedback, as in some example circuits described below, the average output resistance would be $(R_{OP}+R_{ON})/2$, which could be significant for small-area amplifiers as included in integrated circuits (ICs) and which at even a relatively small impedance with respect to the impedance of transducer 47 within the frequency band of interest, could cause "pops" and "clicks" when changing signal path to another amplification stage.

Figure 2B:
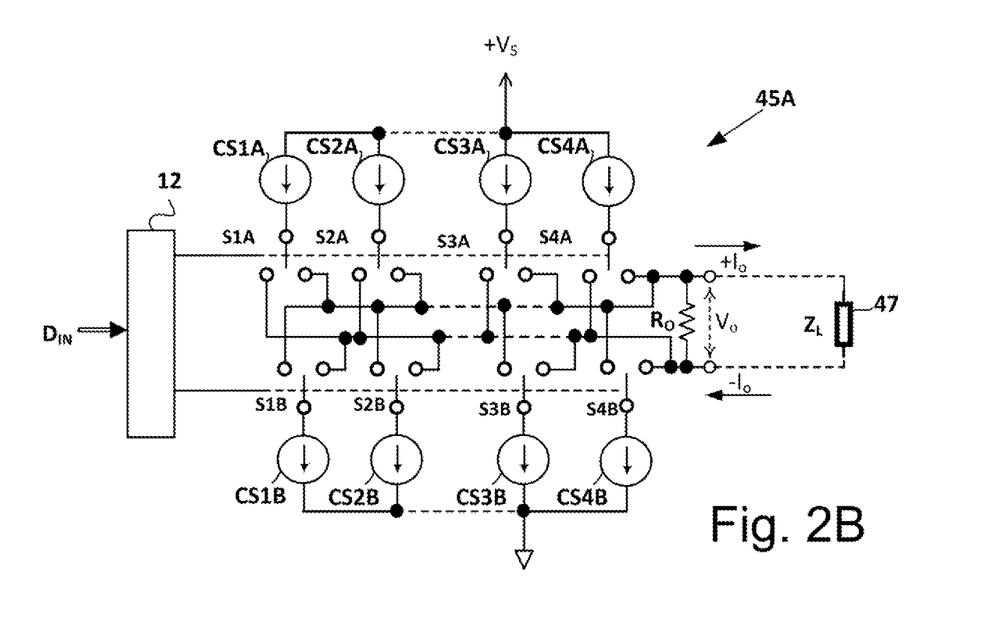
FIG. 2B is a simplified schematic diagram of an example current-output digital-to-analog converter (IDAC) 45A illustrating a circuit having a current-based output that may be included in system 40 of FIG. 4, in accordance with an embodiment of the disclosure.

Referring now to FIG. 2B, a simplified schematic diagram of an example current-output digital-to-analog converter (IDAC) 45A illustrates a circuit having a current-based output that may be included in system 40 of FIG. 4, in accordance with an embodiment of the disclosure. In contrast to amplifier A1 of FIG. 2A, IDAC 45A has a high output impedance, i.e., the output voltage may change dramatically as the load impedance varies, while a constant output current is maintained by a plurality of current sources CS1A-CS4A and current sources CS1B-CS4B that are switched to one of current outputs $+I_O$ or $-I_O$, based on which bits are set in a digital word received by an input register 12 from digital input $D_{IN}$. IDAC 45A includes an output resistor $R_O$ that sets the output impedance presented to audio transducer 47.

Figure 3A:
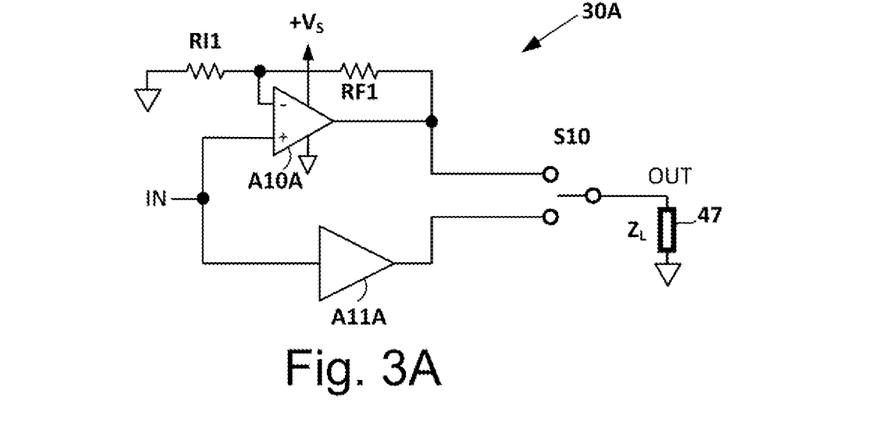
FIG. 3A, FIG. 3B and FIG. 3C are simplified schematic diagrams illustrating various example multi-path output stages that may be included in system 40 of FIG. 4, according to different embodiments of the disclosure.

Referring now to FIG. 3A, a simplified schematic diagram illustrating an example multi-path output stage 30A to which the techniques disclosed herein may be applied, and which may be used in example system 40 of FIG. 4 as described below. A voltage amplifier A11A provides a first signal path to a switch S10 that selects between the first signal path and a second signal path provided by an operational amplifier A10A that includes a feedback network provided by resistors RF1 and RI1 and has an output coupled to another terminal of switch S10. Amplifier A11A does not include feedback and may represent, for example, a buffer at the output of a voltage-output digital-to-analog converter (DAC). Therefore, when switching between the first signal path and the second signal path, a shift in the output impedance of output stage 30A occurs.

Figure 3B:
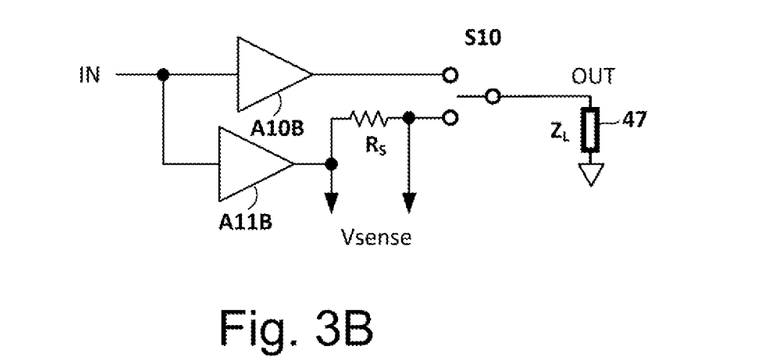

Referring now to FIG. 3B, a simplified schematic diagram illustrating another example multi-path output stage to which the techniques disclosed herein may be applied, and which may be used in example system 40 of FIG. 4 as described below. An amplifier A10B provides a first signal path to switch S10 and an amplifier A11B has an output coupled to another terminal of switch S10 through a sense resistor $R_S$ such as might be used for providing a sense voltage $V_{sense}$ to a current measurement circuit. Amplifier A10B does not include a sense resistor and may represent, for example, a signal path provided to achieve high signal output levels to a transducer without wasting energy in sense resistor $R_S$, or alternatively a circuit in which accuracy of output voltage is necessary and the presence of sense resistor $R_S$ would affect accuracy.

Figure 3C:
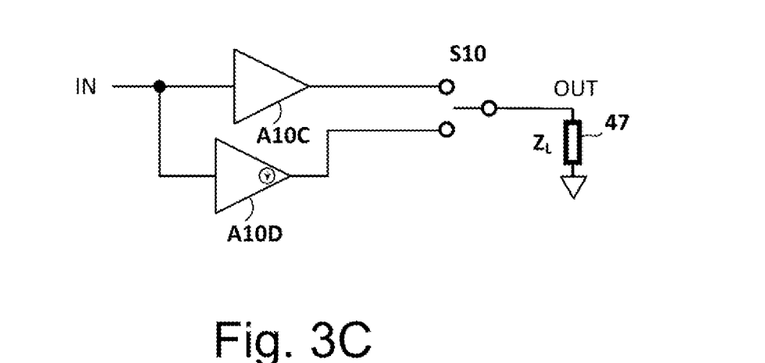

Referring now to FIG. 3C, a simplified schematic diagram illustrating another example multi-path output stage to which the techniques disclosed herein may be applied, and which may be used in example system 40 of FIG. 4 as described below. An amplifier A10D is a current-output amplifier that provides a first signal path to switch S10 generally used for high signal output levels and an amplifier A10C, which is a voltage-output amplifier, provides a signal path provided to reproduce low signal output levels to a transducer for efficiency while amplifier A10D is disabled to conserve energy.

Referring now to FIG. 4, a block diagram of an example system 40 is shown, in accordance with an embodiment of the disclosure. A digital input signal $D_{IN}$ is received by a pair of DACs 43, 45, one of which is an IDAC 45. An equalization filter 42 is provided to modify digital input signal $D_{IN}$ before providing a digital input to IDAC 45 so that the frequency response of the signal path including IDAC 45 may be adjusted to compensate for the frequency-dependent impedance variation of transducer 47. Optionally, equalization filter 42 may also provide compensation in the other signal path through DAC 43. Different sets of coefficients, as provided by a controller 44 may be selected, depending on the selected signal path, which is selected by a selector 48. An analog-to-digital converter 49 is provided to measure a voltage at the output of selector 48 and across transducer 47, so that controller 44 may periodically, or intermittently, such as at power-up, adjust the coefficients of equalization filter 42 to compensate for device-to-device variations. Controller 44 is also coupled to an environment monitor 46 that monitors one or more of: the power supply voltage provided to IDAC 45 (and optionally DAC 43) via a voltage monitor 41A, the temperature of an integrated circuit (IC) that includes the circuits of system 40 or at least IDAC 45 via a temperature monitor 41B, and the temperature of the windings of transducer 47, which may be measured using IDAC 45 to inject a current while measuring the voltage across transducer 47 with ADC 49.

Figure 5:
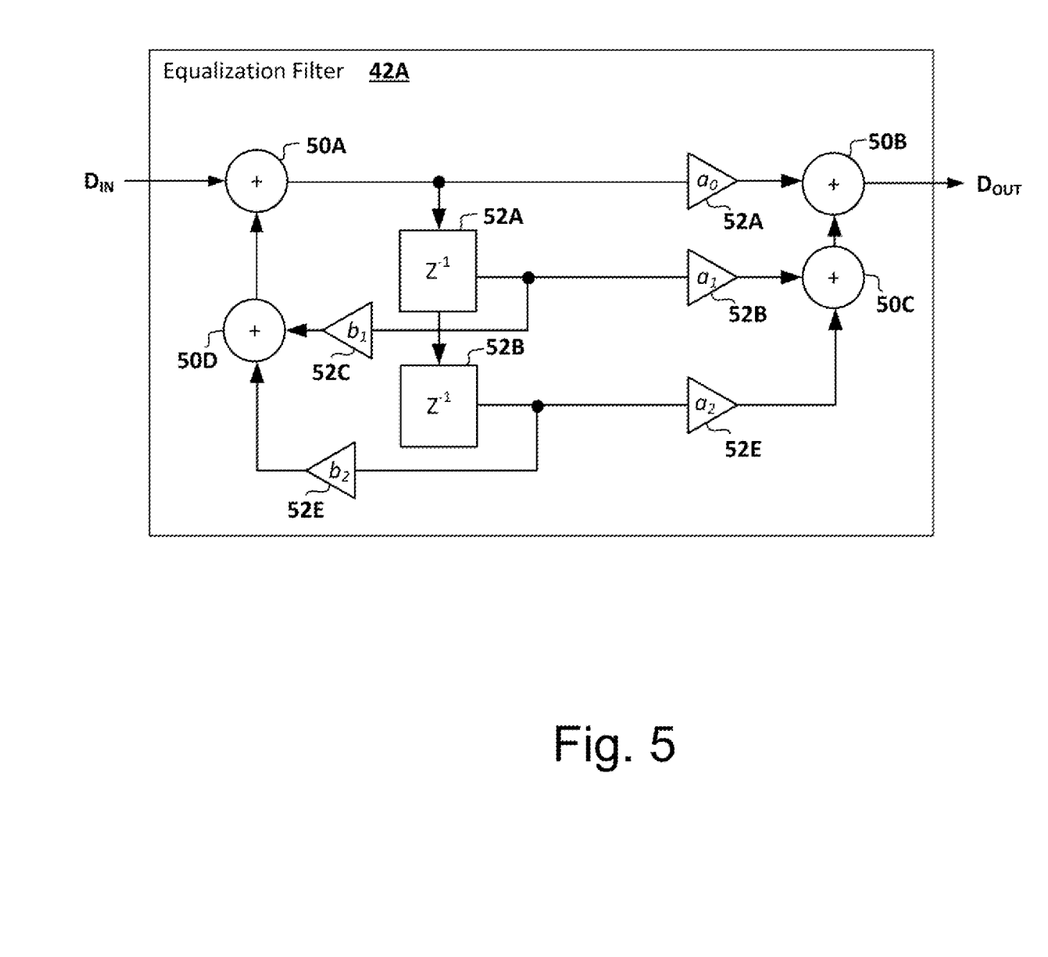
FIG. 5 is a block diagram illustrating an example equalization filter 42A that may be used to implement equalization filter 42 in example system 40 of FIG. 4, in accordance with an embodiment of the disclosure.

FIG. 5 is a block diagram illustrating an example equalization filter 42A that may be used to implement equalization filter 42 in example system 40 of FIG. 4, in accordance with an embodiment of the disclosure. Equalization filter 42A is a second-order biquad infinite impulse response (IIR) filter implemented by a pair of delays 52A, 52B, combiners 50A-50D and scalers 52A-52E to provide a response that is described by:

$$H(z) = \frac{b_0 + b_1 z^{-1} + b_2 z^{-2}}{1 + a_1 z^{-1} + a_2 z^{-2}},$$

which provides two poles and two zeros for shaping the response of equalization filter 42A to the inverse of the frequency response of at least the path through IDAC 45 in system 40 that is due to the interaction between the output impedance of IDAC 45 and the impedance of transducer 47. If multiple paths are to be equalized by equalization filter 42A, then different sets of coefficients $\{a_1, a_2, b_0, b_1, b_2\}$ for each of the signal paths at various system temperatures, transducer temperatures and output stage power supply voltages may be stored in a lookup table or parameterized and changed when an environmental characteristic change is detected, or a new path selection is made from among the signal paths.

Figure 6:
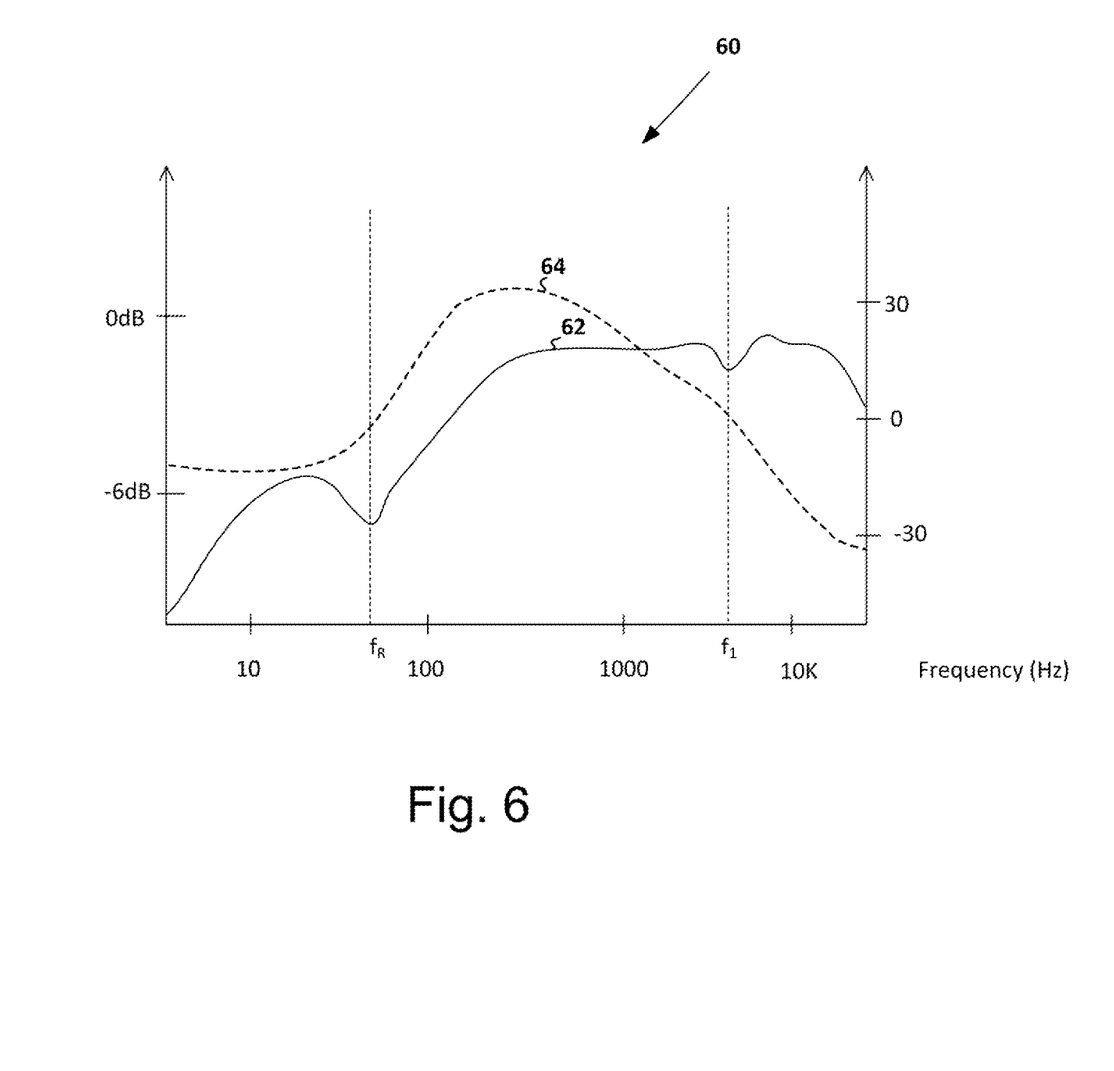
FIG. 6 is a graph 60, illustrating an example amplitude response 62, and an example phase response 64, of an example equalization filter 42 in example system 40 of FIG. 4, in accordance with an embodiment of the disclosure.

Referring now to FIG. 6, a graph 60 of an example filter amplitude response 62, and an example filter phase response 64, of an example equalization filter 42 in example system 40 of FIG. 4, in accordance with an embodiment of the disclosure. In frequency bands of interest, e.g., frequencies adjacent to the fundamental mechanical resonance $f_R$ of transducer, and optionally at other locations such as resonance frequency $f_1$, amplitude response 62 is an inverse of the changes in amplitude response of system 40 due to the output impedance of IDAC 45 interacting with the terminal impedance of transducer 47. Similarly, the phase response 64 is designed to cancel phase shift due to the impedance interaction.

Figure 7:
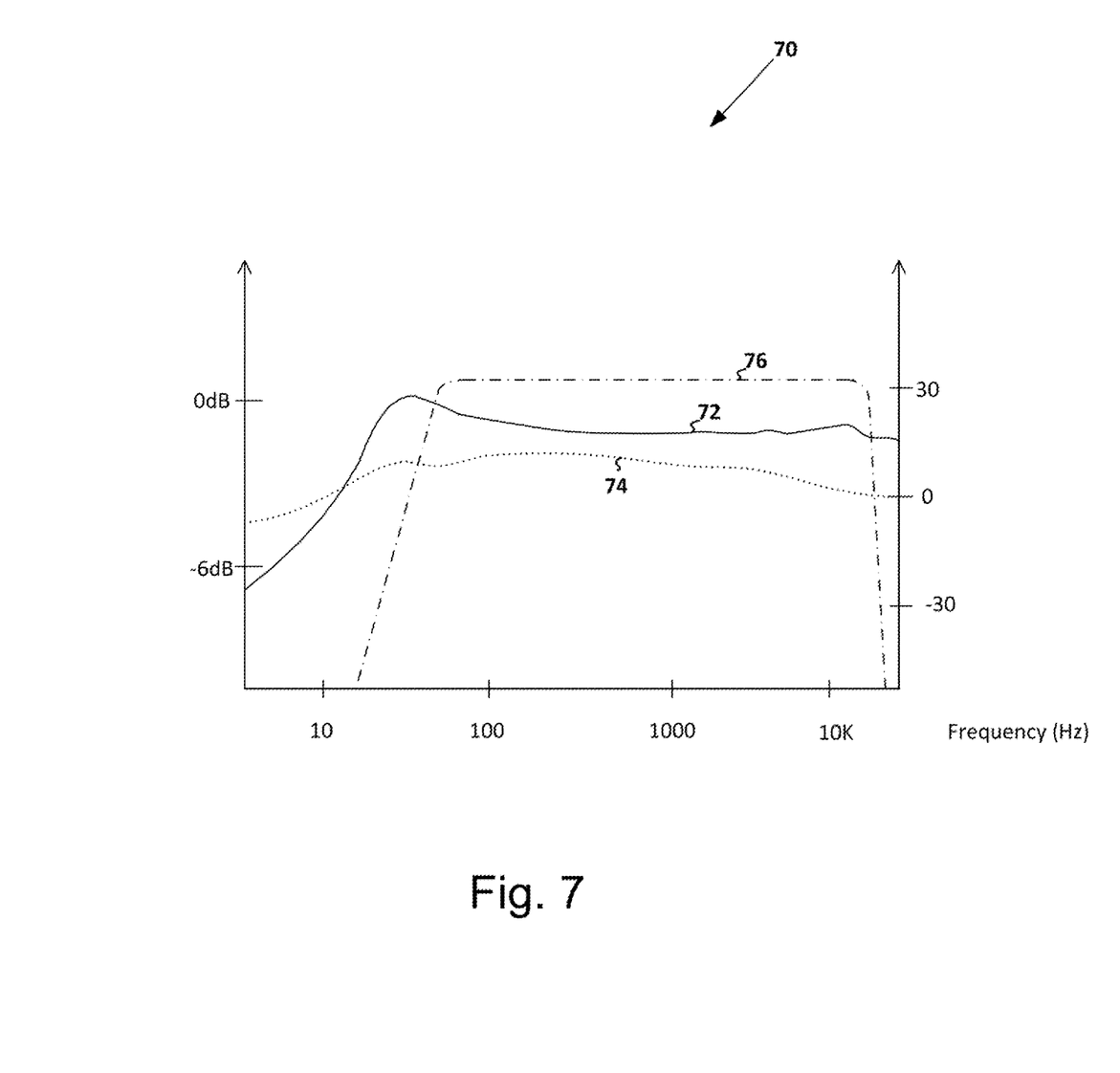
FIG. 7 is a graph 70 illustrating an example target amplitude response 76, an example resulting amplitude response 72, and an example phase response 74 of example system 40 of FIG. 4, in accordance with an embodiment of the disclosure.

FIG. 7 is a graph 70 illustrating an example target amplitude response 76, an example resulting amplitude response 72, and an example phase response 74 of example system 40 of FIG. 4, in accordance with an embodiment of the disclosure. Target response 76 is not intended to show a design target for a result of applying equalization filter 42, but is rather an idealized response showing a flat response over the frequency band of interest, i.e., the range over which the amplitude and phase response of the system should be "flattened" to the degree possible with the order and type of equalization filter 42 being implemented.

In summary, this disclosure shows and describes circuits and systems that implement audio amplification systems that supply an output drive signal to an electromechanical transducer, and methods of operation of the audio amplification systems. The amplification systems may include an input for receiving an audio input signal, a mode selector for selecting one of multiple operating modes of the audio amplification system, and multiple signal amplification paths having inputs coupled to the audio input. The multiple signal amplification paths may have output stages with differing output impedances, and an active one of the multiple signal amplification paths may be selected according to an active one of the multiple operating modes to supply the output drive signal. Outputs of the multiple output stages may be coupled to the electromechanical transducer to provide the output drive signal, and at least one of the multiple signal amplification paths may include an equalization filter for filtering the audio input signal to compensate for phase or gain differences referenced from the input to the outputs of the multiple output stages due to interaction between the differing output impedances and an impedance of the electromechanical transducer.

In some example embodiments, the equalization filter may compensate for phase or gain differences due to interaction between the differing output impedances and a frequency-dependent variation in the impedance of the electromechanical transducer due to a principal mechanical resonance of the electromechanical transducer. A frequency of the principal mechanical resonance of the electromechanical transducer may be in a range between 20 Hz and 2000 Hz. In some example embodiments, an output stage of one of the at least one of the multiple signal paths may provide a current representative of the audio input signal to the electromechanical transducer, and the equalization filter may compensate for a rise in voltage gain at the corresponding output stage due to a frequency-dependent increase in the impedance of the electromechanical transducer due to the principal mechanical resonance of the electromechanical transducer. In some example embodiments, the corresponding output stage of the at least one of the multiple signal paths may be a current-output digital to analog converter, and the input may be a digital audio input that receives a digital audio input signal that provides an input to the current-output digital to analog converter.

Some example embodiments may include an adaptive calibration controller that determines a measure of the interaction between at least one of the differing output impedances and the impedance of the electromechanical transducer and controls a frequency response of the equalization filter in conformity with the measure of the interaction. In some example embodiments, the adaptive calibration controller may determine the measure of the interaction and control the frequency response of the equalization filter in response to a calibration-triggering event that includes one or more of a power up event, a change in temperature of the electromechanical transducer or devices in the least one of the multiple signal amplification paths, or a change in a power supply voltage provided to a corresponding output stage of the at least one of the multiple signal paths. In some example embodiments, in a first one of the multiple operating modes a corresponding first one of the multiple signal amplification paths may have a first output impedance substantially greater than a nominal impedance of the electromechanical transducer, and in a second one of the multiple operating modes a corresponding second one of the multiple amplification paths may have a second output impedance substantially less than the nominal impedance of the electromechanical transducer, and wherein the at least one of the multiple signal amplification paths that includes the equalization filter may include the first one of the multiple signal amplification paths. The first one of the multiple signal amplification paths may be an open-loop signal amplification path, and the second one of the multiple signal amplification paths may be a closed-loop signal amplification path.

In some example embodiments, a first one of the multiple signal amplification paths may have an output resistor coupled between an output of a corresponding first one of the multiple output stages for providing a voltage indicative of a current provided to the electromechanical transducer, and a second one of the multiple signal amplification paths may drive the electromechanical transducer directly from a corresponding second one of the multiple output stages. The at least one of the multiple signal amplification paths that includes the equalization filter may include the first one of the multiple signal amplification paths.

It should be understood, especially by those having ordinary skill in the art with the benefit of this disclosure, that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense. Similarly, although this disclosure makes reference to specific embodiments, certain modifications and changes may be made to those embodiments without departing from the scope and coverage of this disclosure. Moreover, any benefits, advantages, or solutions to problems that are described herein with regard to specific embodiments are not intended to be construed as a critical, required, or essential feature or element.

While the disclosure has shown and described particular embodiments of the techniques disclosed herein, it will be understood by those skilled in the art that the foregoing and other changes in form, and details may be made therein without departing from the spirit and scope of the disclosure. For example, the equalization techniques of the disclosed embodiments may be used in multi-path systems that have a variation in the relationship between the load impedance and output impedance when a path selection is changed.

What is claimed is:

1. An audio amplification system for supplying an output drive signal to an electromechanical transducer, the amplification system comprising:
    an input for receiving an audio input signal;
    a mode selector for selecting one of multiple operating modes of the audio amplification system; and
    multiple signal amplification paths having inputs coupled to the audio input and having corresponding ones of multiple output stages having differing output impedances, wherein an active one of the multiple signal amplification paths is selected according to an active one of the multiple operating modes to supply the output drive signal, wherein outputs of the multiple output stages are selectively coupled to the electromechanical transducer to provide the output drive signal, wherein at least one of the multiple signal amplification paths includes an equalization filter for filtering the audio input signal to compensate for phase or gain differences referenced from the input to the outputs of the multiple output stages due to interaction between the differing output impedances and an impedance of the electromechanical transducer.

2. The audio amplification system of claim 1, wherein the equalization filter compensates for phase or gain differences due to interaction between the differing output impedances and a frequency-dependent variation in the impedance of the electromechanical transducer due to a principal mechanical resonance of the electromechanical transducer.

3. The audio amplification system of claim 2, wherein the corresponding output stage of one of the at least one of the multiple signal paths provides a current representative of the audio input signal to the electromechanical transducer, wherein the equalization filter compensates for a rise in voltage gain at the corresponding output stage due to a frequency-dependent increase in the impedance of the electromechanical transducer due to the principal mechanical resonance of the electromechanical transducer.

4. The audio amplification system of claim 3, wherein the corresponding output stage of the at least one of the multiple signal paths is a current-output digital to analog converter, and wherein the input is a digital audio input that receives a digital audio input signal that provides an input to the current-output digital to analog converter.

5. The audio amplification system of claim 2, wherein a frequency of the principal mechanical resonance of the electromechanical transducer is in a range between 20 Hz and 2000 Hz.

6. The audio amplification system of claim 1, further comprising an adaptive calibration controller that determines a measure of the interaction between at least one of the differing output impedances and the impedance of the electromechanical transducer and controls a frequency response of the equalization filter in conformity with the measure of the interaction.

7. The audio amplification system of claim 6, wherein the adaptive calibration controller determines the measure of the interaction and controls the frequency response of the equalization filter in response to a calibration-triggering event that includes one or more of a power up event, a change in temperature of the electromechanical transducer or devices in the least one of the multiple signal amplification paths, or a change in a power supply voltage provided to a corresponding output stage of the at least one of the multiple signal paths.

8. The audio amplification system of claim 1, wherein in a first one of the multiple operating modes a corresponding first one of the multiple signal amplification paths has a first output impedance substantially greater than a nominal impedance of the electromechanical transducer, wherein in a second one of the multiple operating modes a corresponding second one of the multiple amplification paths has a second output impedance substantially less than the nominal impedance of the electromechanical transducer, and wherein the at least one of the multiple signal amplification paths that includes the equalization filter includes the first one of the multiple signal amplification paths.

9. The audio amplification system of claim 8, wherein the first one of the multiple signal amplification paths is an open-loop signal amplification path, and wherein the second one of the multiple signal amplification paths is a closed-loop signal amplification path.

10. The audio amplification system of claim 1, wherein a first one of the multiple signal amplification paths has an output resistor coupled between an output of a corresponding first one of the multiple output stages for providing a voltage indicative of a current provided to the electromechanical transducer, wherein a second one of the multiple signal amplification paths drives the electromechanical transducer directly from a corresponding second one of the multiple output stages, and wherein the at least one of the multiple signal amplification paths that includes the equalization filter includes the first one of the multiple signal amplification paths.

11. A method of operation of an audio amplification system that supplies an output drive signal to an electromechanical transducer, the method comprising:
receiving an audio input signal;
selecting one of multiple operating modes of the audio amplification system as an active operating mode;
selecting from among multiple signal amplification paths according to the active operating mode, wherein a selected one of the multiple signal amplification paths generates the output drive signal from the audio input signal, wherein the multiple signal amplification paths have corresponding ones of multiple output stages having differing output impedances; and
filtering the audio input signal in at least one of the multiple signal amplification paths with an equalization filter to compensate for phase or gain differences referenced from the input to the outputs of the multiple output stages due to interaction between the differing output impedances and an impedance of the electromechanical transducer.

12. The method of claim 11, wherein the filtering compensates for phase or gain differences due to interaction between the differing output impedances and a frequency-dependent variation in the impedance of the electromechanical transducer due to a principal mechanical resonance of the electromechanical transducer.

13. The method of claim 12, wherein the corresponding output stage of one of the at least one of the multiple signal paths provides a current representative of the audio input signal to the electromechanical transducer, wherein the filtering compensates for a rise in voltage gain at the corresponding output stage due to a frequency-dependent increase in the impedance of the electromechanical transducer due to the principal mechanical resonance of the electromechanical transducer.

14. The method of claim 13, wherein the corresponding output stage of the at least one of the multiple signal paths is a current-output digital to analog converter, and wherein the receiving receives a digital audio input signal that provides an input to the current-output digital to analog converter.

15. The method of claim 14, wherein a frequency of the principal mechanical resonance of the electromechanical transducer is in a range between 20 Hz and 2000 Hz.

16. The method of claim 11, further comprising:
determining a measure of the interaction between at least one of the differing output impedances and the impedance of the electromechanical transducer; and
controlling a frequency response of the equalization filter in conformity with the measure of the interaction.

17. The method of claim 16, further comprising receiving a calibration-triggering event, wherein the determining a measure of the interaction between at least one of the differing output impedances and the impedance of the electromechanical transducer determines the measure of the interaction, wherein the controlling controls the frequency response of the equalization filter in response to receiving the calibration-triggering event, and wherein the calibration-triggering event includes one or more of a power up event, a change in temperature of the electromechanical transducer or devices in the least one of the multiple signal amplification paths, or a change in a power supply voltage provided to a corresponding output stage of the at least one of the multiple signal paths.

18. The method of claim 11, wherein in a first one of the multiple operating modes a corresponding first one of the multiple signal amplification paths has a first output impedance substantially greater than a nominal impedance of the electromechanical transducer, wherein in a second one of the multiple operating modes a corresponding second one of the multiple amplification paths has a second output impedance substantially less than the nominal impedance of the electromechanical transducer, and wherein the at least one of the multiple signal amplification paths that includes the equalization filter includes the first one of the multiple signal amplification paths.

19. The method of claim 18, wherein the first one of the multiple signal amplification paths is an open-loop signal amplification path, and wherein the second one of the multiple signal amplification paths is a closed-loop signal amplification path.

20. The method of claim 11, further comprising:
- coupling an output resistor between the corresponding output stage of a first one of the multiple signal amplification paths and the electromagnetic transducer to provide a voltage indicative of a current provided to the electromechanical transducer; and
- driving the electromechanical transducer directly from the corresponding output stage of a second one of the multiple signal amplification paths, and wherein the at least one of the multiple signal amplification paths that includes the equalization filter includes the first one of the multiple signal amplification paths.

* * * * *